United States Patent [19]

Fulton et al.

[11] Patent Number: 4,670,698

[45] Date of Patent: * Jun. 2, 1987

[54] ADAPTIVE INDUCTION MOTOR CONTROLLER

[75] Inventors: Donald E. Fulton, Stoneham; William P. Curtiss, Winthrop; Jonathan R. Leehey, Malden, all of Mass.

[73] Assignee: IMEC Corporation, Boston, Mass.

[*] Notice: The portion of the term of this patent subsequent to May 2, 2003 has been disclaimed.

[21] Appl. No.: 557,637

[22] Filed: Dec. 2, 1983

[51] Int. Cl.$^4$ .................. H02P 5/40; G01R 27/00
[52] U.S. Cl. .................. 318/802; 318/805; 324/51; 324/59; 324/158 MG
[58] Field of Search .............. 318/803, 805, 802; 324/158 MG, 57 PS, 59, 51; 364/482

[56] References Cited

U.S. PATENT DOCUMENTS

| | | | |
|---|---|---|---|
| 3,643,156 | 2/1972 | Stewart et al. | 364/482 |
| 3,848,186 | 11/1974 | Martyashin et al. | 324/57 R |
| 3,947,760 | 3/1976 | Noguchi et al. | 324/57 R |
| 4,196,475 | 4/1980 | Hall | 364/482 |
| 4,442,393 | 4/1984 | Abbondanti | 318/802 |
| 4,458,196 | 7/1984 | Goyal et al. | 324/57 PS |

*Primary Examiner*—David Smith, Jr.
*Attorney, Agent, or Firm*—Lee & Hollander

[57] ABSTRACT

A method of measuring induction motor parameters so that the speed and torque control of an induction motor controller may be optimized. While the motor is stopped, a test signal made up of a current pulse of a known amplitude is applied to one or more windings of the motor stator for a selected period of time, after which the current pulse is turned off. After a short delay, the instanteous voltage across the stator windings is measured, and also an integration of the stator voltage is started which continues long enough so that the stator voltage decays to substantially zero. The measured voltage and integrated voltage are respectively proportional to the rotor resistance and the motor magnetizing inductance.

22 Claims, 13 Drawing Figures

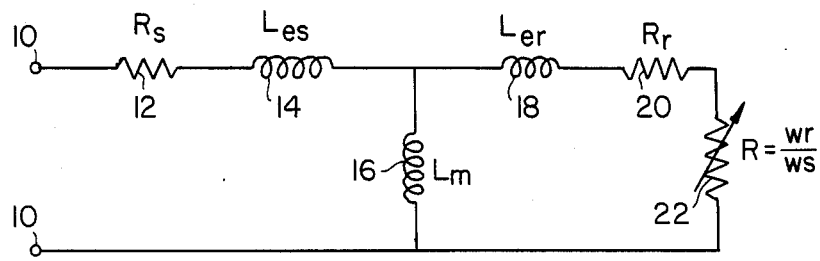
FIG. 1A
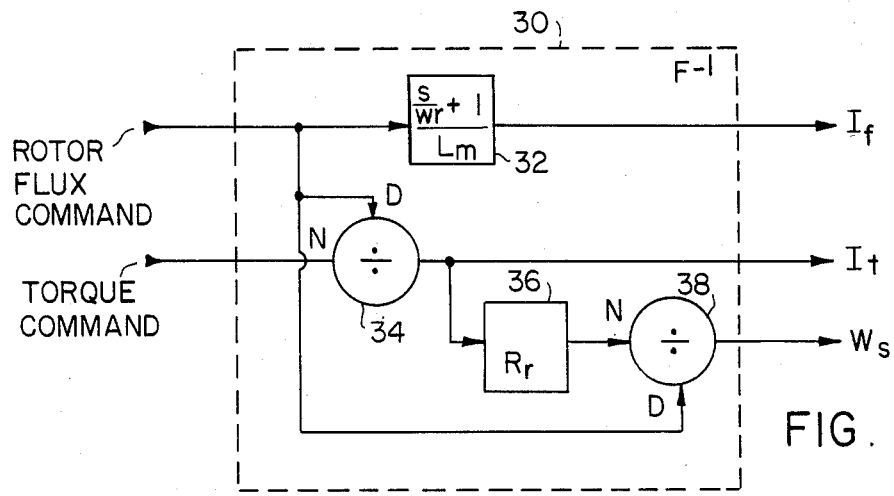
FIG. 1B
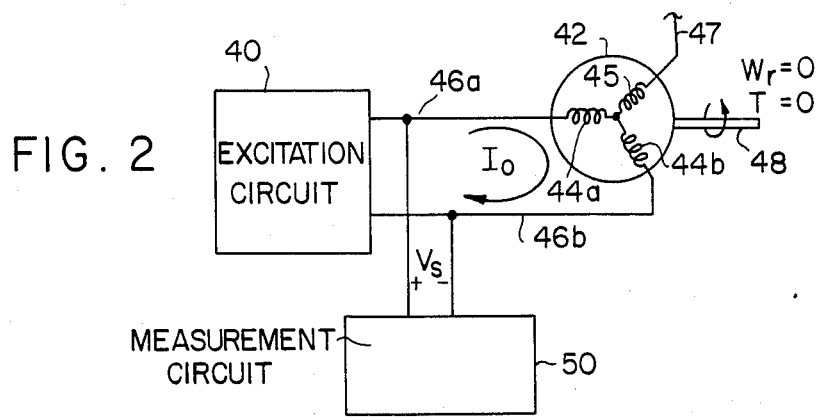
FIG. 2
FIG. 3A
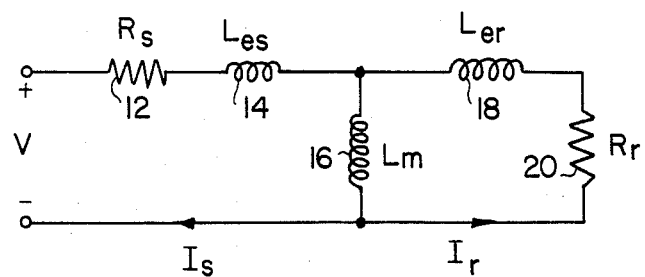

ADAPTIVE INDUCTION MOTOR CONTROLLER

FIELD OF THE INVENTION

This invention relates to induction motor controllers, and more specifically to circuits for electrically probing an induction motor in order to obtain accurate values for motor parameters for use with an adaptive induction motor controller capable of achieving fast and accurate torque control with a variety of different motors.

BACKGROUND OF THE INVENTION

In industrial applications of electric motors, it is frequently important to precisely control the speed or torque output of the motor. Until recently, DC motors hace been almost exclusively used in these applications because their flux and torque may be easily controlled by controlling the field and armature currents of such a motor. DC motors, however, have limitations imposed by their commutators and brushes, including the need for periodic maintenance, limitations on maximum speed in order to achieve reasonable brush life, contamination of the brushes in hostile environments, and the limited capacity of the commutator and brushes to conduct current and to withstand high-voltage operation.

Induction types of AC motors have no brushes or commutators. Induction motors are simpler, more rugged, and generally superior mechanically to DC motors. Additionally, induction motors are much less expensive than DC motors, and an induction motor can cost as little as one fifth as much as the equivalent horsepower DC motor. Until recently, however, the use of induction motors in high performance applications has been limited due to the inability of induction motor controllers to achieve torque and speed control which is as accurate as that which can be achieved with DC motor controllers. Most commercially available induction motor controllers are variable voltage source drives that operate in an open-loop, constant volts/Hz manner. While these types of controllers may be easily used with motors of different design and horsepoower, the dynamic performance of such controllers is poor, and attempts to achieve rapid torque response typically result in tripping the over-current protection of the motor or controller.

Recently, flux-feed-forward types of induction motor controllers, also known as vector-type controllers or field-oriented controllers, have been developed which are capable of producing excellent dynamic and static torque response at all speeds from a standard induction motor. To achieve accurate torque and speed response from a motor controlled by a flux-feed-forward type of controller, it is necessary for the controller to know the values of key motor parameters very accurately, especially the magnetizing inductions and rotor resistance. The value of the magnetizing inductance is required to set the flux level in the motor, and the value of the motor resistance must be known for the slip frequency to be optimally controlled.

In actual practice, it is difficult to precisely know these values. For example, a 50° C. rise in temperature may increase the motor rotor resistance by 20–30%, and this change in rotor resistance will generally occur as a motor is used and heats up. The motor inductance is relatively stable with time and temperature changes. Motor inductances of different types or horsepower capacity motors, however, tend to vary widely. Thus, a flux-feed-forward motor controller designed to work with a particular motor will not provide accurate control of torque and speed when used with a different motor, even one having the same horse power. Even with nominally identical motors, small variations in the air gap and other parameters which are within mormal production tolerances may result in significant changes in motor inductance. Thus, flux-feed-forward types of controllers for induction motors have generally required that they be individually ajusted to provide optimum control over the motor output torque. This prevents motor controllers from being easily interchangeable between different motors, and, as discussed above, results in degraded control of the motor torque output as the rotor resistance of the motor changes with changes in temperature.

SUMMARY OF THE INVENTION

The present invention includes a novel method of measuring motor parameters with great accuracy so that the torque and apeed control of an induction motor controller may be optimized. More specifically, the present invention may be used with a flux-feed-forward type of motor controller to adaptively change the parmeters of the controller so that they closely match the induction motor being controlled. The result is that a single flux feed forward type of controller may be used with a broad range of induction motor designs, horsepowers, and voltages without requiring individual adjustment of the motor controller for each different motors.

Briefly, the present invention includes a method in which an induction motor is directly probed with an electrical test signal applied to the stator windings of the motor. In a three-phase motor, for example, a current pulse would be driven through two windings of the motor while the voltage across these windings is monitored. While the motor must be stopped during the probe, the probe signal applied to the motor produces zero torque and no rotor motion so that the motor does not have to be disconnected from its load. In industrial applications, motors frequently perform repetitive operations separated by periods when the motor is not being used. The present invention may be used to probe the motor during these periods when the motor is not operating, and since no torque or motion is produced by the probe, the motor need not be disconnected from its load. Such operation allows the motor controller parameters to be periodically updated as the rotor resistance changes with operating temperature. Furthermore, a single motor controller may be used with different types and sizes of motor. The present invention is especially useful with motor controllers in which a microprocessor performs the calculations which are dependent on the motor parameters. In these types of systems, it is extremely easy to read from the present invention the values of the motor parmeters, enabling the motor controller to optimally adapt itself to the motor at all times.

DESCRIPTION OF THE DRAWINGS

The advantages and operation of the present invention will be more fully understood and appreciated upon reading the following description of the preferred embodiment in conjuction with the drawings of which:

FIGS. 1A and 1B are circuit diagrams of an induction motor and a controller therefor;

FIG. 2 is a block diagram showing how the present invention would measure induction motor parameters;

FIGS. 3A, 3B and 3C are simplfifed models of the induction motor shown in FIG. 2;

DESCRIPTION OF PREFERRED EMBODIMENT

Figure 3B:
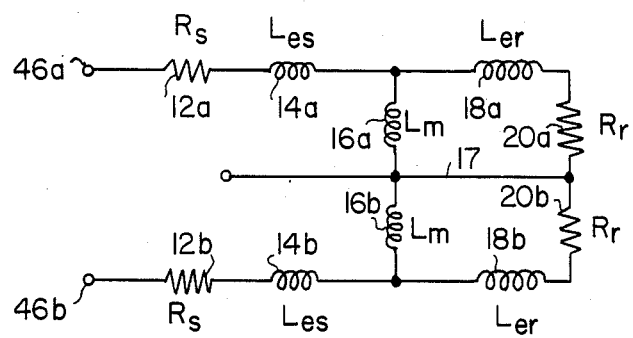

FIG. 1A is a schematic diagram representing an equivalent circuit of one phase of an induction motor. In FIG. 1A, $R_s$ represents the stator resistance, $L_{es}$ represents the stator leakage inductance, $L_{er}$ represents the rotor leakage inductance, $R_r$ represents the rotor resistance, R represents the power absorbed by the motor load, and $L_m$ represents the mutual inductance coupling the rotor and stator fields. FIG. 1B is a block diagram of a flux-feed-forward type of induction motor controller. In FIG. 1B circuit 30 is the inverse of a circuit which models the transfer function of an induction motor. Two inputs to circuit 30 determine the motor flux level and the torque. The motor controller circuit 30 provides three outputs. Two outputs, designated as $I_f$ and $I_t$, represent the magnitudes of quadrature components of the stator current. The motor controller 30 provides a third output, $w_s$, which is the slip frequency of the motor. The slip frequency $w_s$ is equal to the difference between the frequency of the stator field and the rotational velocity of the motor shaft. In circuit 30, $w_r$ represents the rotor rotational velocity. A more complete discussion of the derivation of the motor controller circuit shown in FIG. 1B may be found in "An Approach to Flux Control of Induction Motors Operated With Frequency Power Supply," by A. Nabae, et al., IEEE/IAS Conference Record 1978, pages 890–894. As can be seen from FIG. 1B, a flux-feed-forward motor controller requires only the values of the mutual inductance $L_m$ and the rotor resistance $R_r$ to accurately control an induction motor. Thus, if these two values may be accurately determined, the output torque from an induction motor may be accurately controlled.

FIG. 2 illustrates the method by which the present invention probes an induction motor to measure the inductance and rotor resistance. An excitation circuit 46a is connected across two windings 44a and 44b of a three phase induction motor 42. The excitation circuit applies a current pulse designated as $I_o$ which flows from excitation circuit 40 on line 46a, through stator windings 44a and 44b and back to the excitation circuit 40 on line 46b. The third stator winding 45 is disconnected while the motor 42 is being probed. Since the $I_0$ current pulse flowing through motor 42 is a constant DC current and since no current flows in winding 46, a DC flux field is produced in the motor, and the motor shaft will not rotate or provide any output torque during the measurement. A measurement circuit 50 is connected to lines 46 and measures the voltage $V_s$ across stator windings 44 during and after the occurrence of current pulse $I_0$. As explained in detail below, by properly processing the voltage $V_2$, the motor inductance and rotor resistance may be precisely determined.

In the case where an induction motor is providing zero output torque, the resistance R, representing power absorbed by the load, equals zero. The equivalent circuit of FIG. 1A can then be simplified to the circuit shown in FIG. 3A. In the embodiment shown in FIG. 2, the $I_o$ stator current pulse flows through two stator windings 44a and 44b, and likewise the stator voltage measured by circuit 30 is measured across both windings. Thus, the actual motor circuit being probed may be represented as shown in FIG. 3B which shows the equivalent circuit for 2 stator windings connected in series.

Figure 3C:
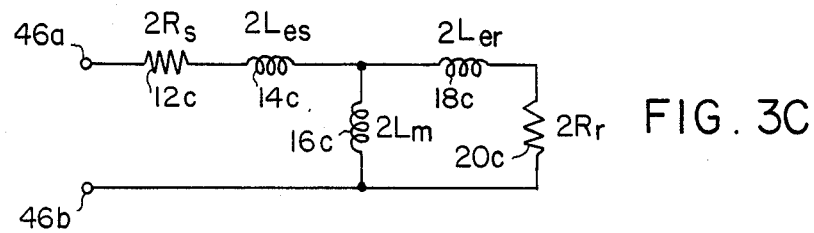

Line 17 in FIG. 3B represents the neutral node in motor 42. An inspection of FIG. 3B reveals that due to the symmetry of the circuit, no current will flow through line 17 which connects the junction of mutual inductances 16a and 16b with the junction of rotor resistance 18a and 18b. Thus, line 17 may be eliminated. The circuit of FIG. 3B then reduces to that shown in FIG. 3C. As might be expected, FIG. 3C, representing 2 stator windings connected in series, is the same as the single-winding equivalent circuit of FIG. 3A except that the component value are doubled.

Figure 4:
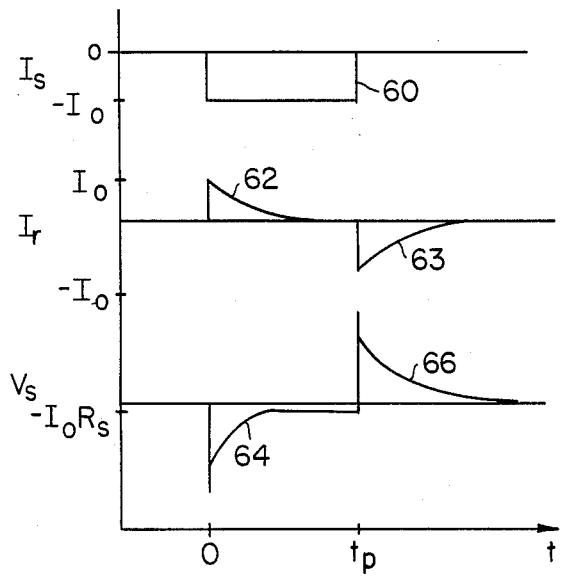
FIGS. 4 and 5 represent voltage and current wave forms occurring in the motor when the motor parameters are being measured.

FIG. 4 shows the stator current and voltage and the rotor current which result from the application of a current pulse to motor 42 by the circuitry shown in FIG. 2. Waveform 60 represents the current pulse produced by excitation circuit 40 and applied to windings 44 of motor 42. The current pulse starts at time t=0 and has an amplitude of $I_0$. The duration of the pulse is $t_p$ and is typically approximately 5 to 10 times the length of the rotor time constant, as described below.

Waveform 62 represents the rotor current produced by the current pulse $I_0$ applied to the stator windings. At the beginning of the pulse, the rapid change in the magnetic field applied to the rotor causes a large voltage and hence, a large current, to flow in the rotor. This current decays in a roughly exponential manner to a negligible level after a few rotor time constants. When the stator current is abruptly turned off at time $t_p$, the collapsing magnetic field induces a rotor current similar to the waveform produced at the beginning of the current pulse, but opposite in polarity.

Waveform 64 in FIG. 4 shows the voltage across lines 46, i.e., the voltage across stator windings 44. At the beginning of the $I_0$ pulse, there is a voltage spike across the stator windings caused by the impedence of the stator inductance to the rapid rise of the current pulse. This voltage then decays to a steady state value. The steady state value is equal to $2.I_0R_s$, the voltage drop across two stator resistances 12 caused by the $I_0$ current pulse. The time constant of the exponential waveform is a function of both stator and rotor parameters, since the current flowing in the rotor windings, as shown by waveform 62, will cause a changing magnetic field which contributes to the voltage across stator windings 44.

At the end of the $I_0$ current pulse in the stator winding, the current through the stator windings returns to zero at time $t_p$. This causes a rapid reduction in the current through the stator leakage inductance $L_{es}$ resulting in a very large voltage spike across lines 44. The voltage across lines 44 following $t_p$ is shown by waveform 66 in FIG. 4. The voltage spike decays relatively quickly due to the low inductance of the leakage inductance $L_{es}$. Following this voltage spike, the voltage across lines 44 is approximately exponential and decays to zero. This voltage is produced by the decaying magnetic flux caused by the rotor current $I_r$ shown by waveform 63. It can be seen from FIG. 3 that in an idealized motor, the time constant and magnitude of the rotor current 63 are determined by only the rotor resistance and the rotor inductance. Since no current flows in the stator windings after the end of the $I_0$ pulse, there is no voltage drop across either the stator resistance $R_s$ or leakage inductance $L_{es}$. Thus, the voltage across lines 44 during the end of waveform 66 is determined solely by the rotor inductance and resistance.

Figure 5:
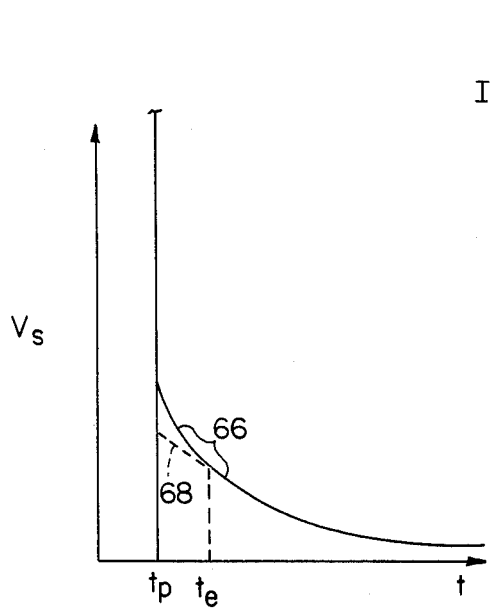

The motor model shown in FIG. 3C is, of course, an idealized model of a perfect motor, and not all physical processes occurring in the motor are represented by this model. Of particular interest to the present invention, eddy current effects are not represented in the model. The voltage across line 44 following the end of the $I_o$ pulse shown in more detail in FIG. 5. In FIG. 5, the $I_0$ stator current pulse returns to zero at a time $t_p$. As described above, a large voltage spike occurs across the motor terminals at this time. Following this, the voltage across the motor terminals decays roughly exponentially, and is determined by the rotor resistance and inductance. There is, however, a short period of time from $t_p$ to $t_c$ during which eddy current effects in the motor will be reflected in the voltage across the stator windings. The eddy current effects are caused by the rapid flux variation in the motor when the stator current pulse $I_0$ is abruptly terminated. The time required for the eddy current component of the stator winding voltage to decay is typically a few milliseconds. If the waveform following the initial voltage spike were a perfect exponential waveform, the voltage across the stator windings would be as shown by dotted line 68. Eddy current effects, however, will be significant for a few milliseconds and will cause the actual voltage measured to be shown by the solid line waveform 66.

From the analysis presented above and with reference to FIGS. 3, 4 and 5, it can be seen that the rotor resistance and inductance can be most easily determined by processing the stator voltage waveform occurring after the end of the $I_0$ stator current pulse. The stator voltage during the $I_0$ waveform is less suitable for determining rotor parameters because of the voltage drop across the stator resistance $R_s$, which may not be known and which changes with temperature. The stator voltage waveform occuring after the end of the $I_0$ current pulse is initially corrupted by the voltage spike caused by the stator leakage inductance and by eddy current effects. These last for only a few milliseconds, however, and the remaining portion of the waveform is essentially determined by only the rotor inductance and rotor resistance. Thus, by appropiately processing a particular portion of the voltage across the motor terminals following the end of the stator current pulse $I_0$, the rotor inductance and resistance may be determined.

Figure 6:
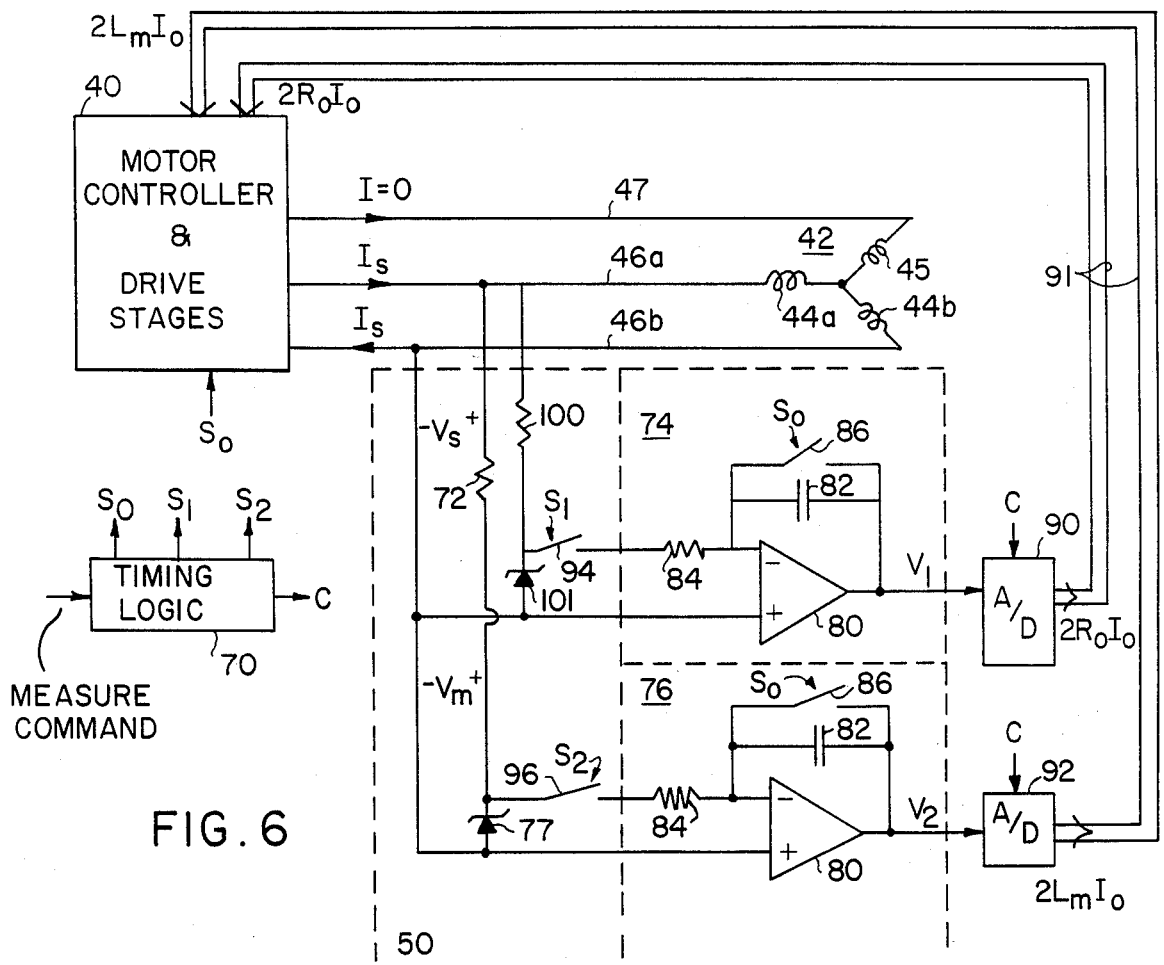
FIG. 6 shows one embodiment in which the present invention is used to measure motor parameters.

FIG. 6 shows one circuit for measuring the motor parameters as described above. A motor controller and drive stage 40 is connected to the three windings 44a, 44b, and 45 of an induction motor 42. During normal operation, motor controller 40 will apply the appropriate three-phase waveforms to the induction motor to rotate the motor shaft at the desired speed and to output a desired torque. Circuitry tor doing this is well-known in the art. It should be apparent that the present invention may be used with motors having more or less than three phases and with various types of induction motor drive circuits, including current-source and pulse-width-modulation types of drives.

Figure 7:
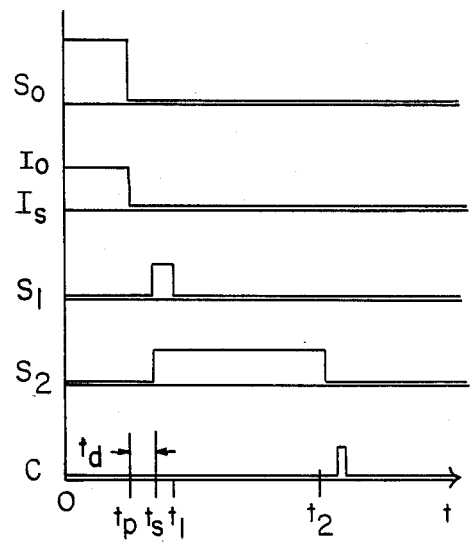
FIGS. 7 and 8 represent waveforms occurring in the circuitry of FIG. 6.

The measurment of motor parameters may be done at any time that the motor is stopped and not providing output torque. Timing logic circuitry 70 provides several signals described below which control the timing of various operations performed during the measurement cycle. Typically, a Measure Command signal is applied to timing logic 70 by a digital processor or other input signal source to start the measurement cycle. The Measure Command, however, may be provided by any source, including a manually operated switch for periodically recalibrating a motor controller. Timing logic 70 provides four output signals designated as $S_0$, $S_1$, $S_2$, and C, which are described below. The relation of these signals is shown in FIG. 7. As will become clear upon reading the following description of the timing logic signals, the circuitry necessary to provide these signals is straightforward and easily implemented by one of ordinary skill.

Measurement circuit 50 is connected across lines 46a and 46b to motor 42. To begin measurement cycle, timing circuit 70 applies the $S_0$ signal pulse to controller 40. In response, controller circuit 40 disconnects lead 47 and forces a current pulse through stator windings 44, as shown in FIG. 7. The voltage across lines 46 is applied via a resistor 72 to the input of two integrating circuits 74 and 76. A zener diode 77 or other device for limiting the input voltage to the integrators is connected across lines 46. The voltage spike occurring at the beginning of the $I_0$ current pulse is shunted by diode 77 conducting in the forward direction, and the voltage spike occurring at the end of the $I_0$ current pulse is clamped to the zener voltage of diode 77. Resistors 72 and 100 serve to limit the current through diodes 77 and 101 both during measurment periods and during normal operation of the motor. Integrators 74 and 76 integrate the voltage across lines 46, and the size of resistors 72 and 100 is large enough so that negligable current is drawn during normal motor operation. Limiting the voltage applied to integrators 74 and 76 ensures that the integrator circuits are not saturated by either the negative or positive voltage spikes across windings 46. This is very important since the voltage spike at time $t_p$ may be several hundred volts. The voltage integrated by integrators 74 and 76 is typically a few volts. A simple circuit for integrating a signal of a few volts might be adversely affected by the spike and could provide in response an incorrect output value at the end of the integration.

Integrators 74 and 76 are reset integrators. In FIG. 6 these integrators are constructed as conventional operational amplifier integrators, including operational amplifiers 80 having integrating capacitors 82 connected from the outputs to the inputs thereof, and having input resistors 84. The time constants of integrators 74 and 76 are set by the respective values of the resistors 84, 72, and 100 and capacitor 82. The value of these time constants are discussed below. Each integrator has a switch 86 connected across capacitor 82 for resetting the integrator to zero prior to each integration. Switchs 86 may be controlled, for example, by the $S_0$ signal which produces the $I_0$ stator current pulse.

The outputs of integrators 74 and 76 are respectively applied to two A/D converters 90 and 92. In response to a convert signal C from timing logic 70, A/D converters 90 and 92 provide a digital representation of the voltage present at the outputs of integrators 74 and 76.

The input to integrator 74 is applied through a switch 94 which is controlled by the $S_1$ signal from timing logic 70. Similarly, the input to integrator 76 is controlled by a switch 96 which is controlled by the $S_2$ signal from timing logic 70.

Figure 8:
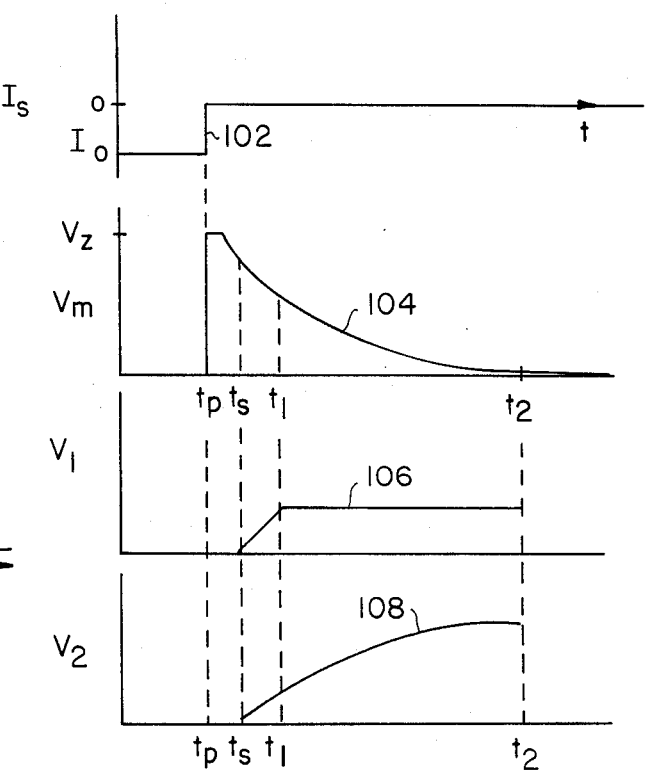

The operation of the circuitry shown in FIG. 6 will be described with reference to the waveforms shown in FIGS. 7 and 8. The measurement cycle begins with a current pulse having a magnitude of $I_0$ being driven through stator windings 44a and 44b. This is shown by waveform 102 in FIG. 8 which represents the stator current $I_S$ flowing in lines 46. The duration of the current pulse is determined by the rotor time constant, which is typically on the order of several hundred milliseconds. The $I_0$ current pulse should be long enough that the voltage across lines 46 and the magnetic flux within the motor reach a substantially steady-state condition during the current pulse. Typically, the $I_0$ current pulse will have a duration $t_p$ of a few seconds or less.

At time $t_p$, the current $I_s$ through stator windings 44 goes to zero. As explained above, the voltage $V_s$ across stator windings 44 at this time is very large current spike having a short duration. The $V_m$ voltage applied to integrators 74 and 76, however, has this voltage spike clamped to a level determined by the zener voltage of diodes 77 and 101, as shown by waveform 104 in FIG. 8, which shows the $V_m$ voltage being clamped to the zener voltage $V_z$ during the voltage spike. As shown in FIG. 7, the $S_1$ and $S_2$ timing signals which control integrators 74 and 76 both go high at time $t_s$, which is a short period of time after the stator current pulse goes low at time $t_p$. The interval between $t_p$ and $t_s$ is to allow eddy current effects in the motor to decay. These effects last for a few milliseconds, and the interval between $t_p$ and $t_s$ is typically on the order of one to five milliseconds. This time may be shorter or longer, depending on the parameters of the particular motors being controlled. As discussed in more detail below, the exact length of the interval between $t_p$ and $t_s$ is not critical, and thus, a single measurement circuit may be used with a wide range of motor capacities and types.

At time $t_s$, the $S_1$ and $S_2$ signals go high closing switches 94 and 96. This applies the stator voltage across windings 46 to the inputs of integrators 74 and 76. The output of integrator 74 is designated in FIG. 6 as $V_1$ and is shown in FIG. 8 by waveform 106. The output of integrator 76 is $V_2$ and is shown in FIG. 8 by waveform 108. Integrator 74 integrates the stator voltage for a short period of time, typically 5 to 50 milliseconds, and at time $t_1$ after time $t_s$, the $S_1$ timing signal goes low opening switch 94. The $V_1$ output from integrator 74 will then remain constant until the integrator is reset by closing switch 86.

Integrator 76 integrates the stator voltage waveform for a longer period of time. Typically, integrator 76 will integrate the stator voltage for an interval equal to several rotor time constants until the stator voltage across lines 46 has decayed to substantially zero. This is shown in FIG. 8 by waveform 108. Waveform $S_2$ returns low at time $t_2$. Following time $t_2$, the convert command C goes high and A/D convertors 90 and 92 convert the output voltages $V_1$ and $V_2$ of the integrators to provide a digital representation thereof. These values are used to set the appropriate values in the motor controller circuitry as schematically represented by lines 91.

The magnitude of the output $V_1$ from integrator 74 is proportional to $2R_rI_0$. This can be seen from the following explanation. Referring to FIG. 3C, at the end of the stator current pulse, a steady state condition exists in which the current through mutual inductance 16c equals $I_0$. This is because once the steady state condition is reached, the impedance of inductor 16c is essentially zero and negligible current will flow in the rotor circuit which is connected in parallel with the mutual inductance 16c and which has a resistance of $2R_r$. When the stator current goes to zero, at time $t_p$, the current flowing through mutual inductance 16c will tend to remain constant and must flow through the rotor circuit.

Thus, immediately after time $t_p$, the current flowing in the rotor is approximately $I_0$. This produces a voltage drop of $2R_r I_o$ across the rotor resistance 20c. The voltage measured across terminals 46 is actully slightly less than the voltage drop across the total rotor inductance by approximately $L_{er}/L_m$ times the voltage. As discussed above, the value of $L_{er}/L_m$ is approximately equal to 0.025, and the voltage measured across terminals 46 immediately after the stator current pulse ends is substantially equal to $2I_0R_r$.

The preceeding discussion neglects the time delay effects discussed above in connection with FIG. 5. Starting the integrations at $t_s$ instead of $t_p$ changes the proportionality constant of the integration by a factor equal to $e^{t_d/T_r}$ where $T_r$ is the rotor time constant, and $t_d$ equals $(t_p-t_s)$. As long as the delay time $t_d$ is much less than approximately 10% of $T_r$, this factor may be considered to be equal to 1. Thus, the output voltage $V_1$ from integrator 74 is given by the following equation:

$$V_1 = I_oR_r \int_{t_s}^{t_1} (e^{-(t/T_r)})dt$$

In other words, since the integration time $(t_s-t_1)$ and the magnitude of the current pulse $I_0$ are known, the value of the rotor resistance is proportional to, and hence may be determined by measuring, the voltage across lines 46 a few milliseconds after the end of the stator current pulse. The circuitry shown in FIG. 6 measures this voltage by integrating it for a short period of time. Alternatively, other types of circuitry such as a sample and hold circuit could be used to measure this pulse. The integration method is preferred because of the filtering provided by integrator 74.

The $V_2$ output from integrator 76 is equal to $2L_mI_0$. This may be seen from the following explanation. The flux in the motor at the end of the stator current pulse is equal to the motor inductance times the current flowing therethrough, which is $2L_mI_0$. This flux decays approximately exponentially with time constant equal to the rotor time constant $T_r$. Thus, the motor flux F as a function of time is given by the following equation:
$$F=2L_mI_oe^{-t/T_r}$$

The voltage induced in the stator windings after the stator current goes to zero is equal to the time derivative of the flux as it decays, and when this value is integrated by integrator 76 over an interval which is substantially zero to infinity (actually from time $t_s$ to any time longer than about five rotor time constants) the final value is equal to $2L_mI_0$. It should be noted that this method of determining the rotor inductance automatically takes into account any nonlinearity of the magnetizing inductance such as that shown in FIG. 10, because the circuitry is measuring the actual flux and computing the average magnetizing inductance (defined as the ratio of flux to current) at the particular current level $I_0$ of the stator current pulse. Similar to integrator 74, integrator 76 actually starts at time $t_s$ rather than $t_p$ in order to allow eddy current effects to decay, but as long as $t_d$ is much smaller than $T_r$, this factor is again substantially equal to 1.

Figure 9:
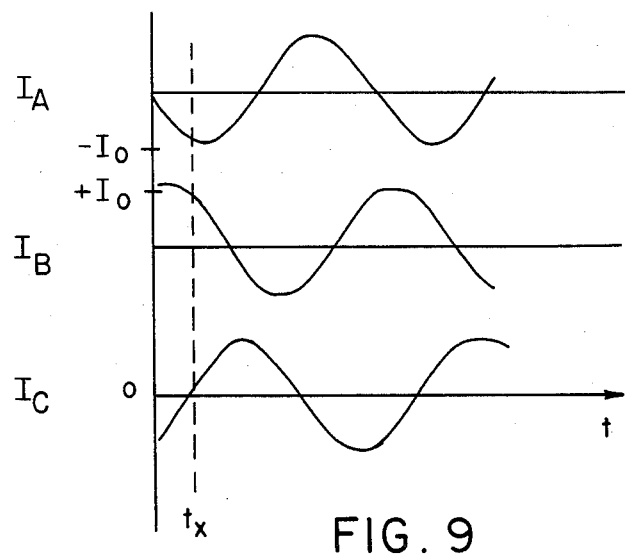
FIG. 9 shows the relationship between the currents in the three stator windings of a three phase induction motor.

In general, the line-to-neutral model of an induction motor, such as shown in FIGS. 1 and 2, is only strictly applicable for balanced steady-state sinusoidal currents. FIG. 9 shows the current waveforms flowing in the three-windings of a three-phase motor during operation. At time $t_x$, the current $I_c$ in one winding is zero and the currents $I_A$ and $I_B$ in the order two windings are equal in magnitude and opposite in polarity. Thus the method of the present invention of exciting a motor with a DC current in only two phases is not an artificial condition. This method produces a flux in the motor that is the same as the instantaneous flux occurring at time $t_x$ in FIG. 9. This fact is important when the nonlinearities of the motor inductance are considered. The probe current pulse magnitude can be directly scaled to the actual value of operating current in order to test the motor at a particular operating current or flux level.

Figure 10:
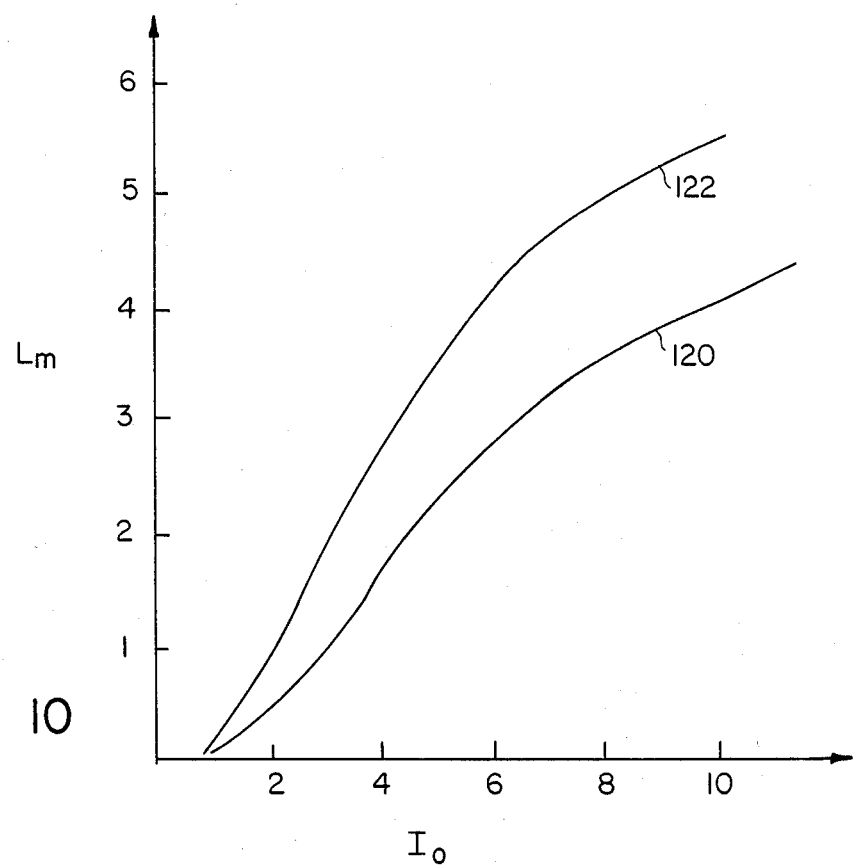
FIG. 10 is a graph showing the magnetic saturation characteristics of two typical induction motors.

FIG. 10 is a graph showing values measured for motor inductance $L_m$ verses the magnitude $I_0$ of the current pulse for two different motors. $I_0$ is in amps and $L_m$ is in arbitrary units. Both motors are 5 horsepower induction motors. Curve 120 is for standard motor and curve 122 is for an energy efficient motor. Even though the motors are the same size, the inductances vary greatly. Notice that the motors start to appreciably saturate above six or seven amps DC. An $I_0$ of six amps corresponds to a sinusoidal magnetizing current of about five amps RMS which is a realistic operating value for a typical 5 horsepower, 230 volt motor. The reason that the curves do not pass through the origin is due to the coercive force of the magnetic material. At low currents, a disproportionately small amount of flux is generated. It should be appreciated that the nonlinearity of the motor inductance is automatically accounted for by the measurement process of the present invention because the inductance measured is the large signal or average inductance (defined as the ratio of flux to current) at the particular current level used for the test. By conducting a series of tests at different current levels $I_0$, the motor parameters over a wide operating range may be quickly and accurately determined.

It is desireable to start the integrations as soon as possible after the stator current is truned off. Too long of a delay will degrade the measurements since the exponential scaling factor is not known exactly a priori. The minimum delay time depends upon how fast the eddy current voltage decays. If the delay $t_d$ can be kept to less than ten milliseconds, a $T_r$ in the typical range of 100–400 milliseconds would at most cause a small error. For a delay of ten milliseconds, the exponential factor is 1.07 with $T_r=150$ milliseconds, and is 1.025 with $T_r=400$ milliseconds. Typically, a delay of four to eight milliseconds will be adequate.

The preceding explanation has described new and improved circuitry and techniques for measuring parameters of induction motors. It should be appreciated that modifications and additions may be made to the embodiments described herein while still taking advantage of the improvements of the present invention over the prior art. Accordingly, the description herein of a preferred embodiment for purposes of illustrating the invention should not be construed as a limitation of the present invention. Rather, the present invention should be limited only in accordance with the following claims.

What is claimed is:

1. Apparatus for measuring the inductance and rotor resistance of an induction motor, comprising:
    means for applying a signal across one or more stator windings of the motor to cause a DC current pulse of a substantially constant magnitude to flow through the one or more windings for a first interval of time;
    means for preventing current from flowing through said one or more windings after the end of the first interval; and
    means, responsive to the voltage across said one or more windings, for processing the voltage to determine the inductance and rotor resistance of the induction motor.

2. The apparatus of claim 1 wherein the means for processing includes:
    means for measuring the amplitude of the voltage following the end of the first interval and for providing in response thereto a value representative of the rotor resistance; and
    means for integrating the voltage over a second interval which begins after the end of the first interval and which extends until the voltage is substantially zero.

3. The apparatus of claim 2 wherein the first interval is substantially longer than the rotor time constant of the motor.

4. The appartus of claim 3 wherein the first interval extends until current flow in the rotor induced by the current pulse has decayed to substantially zero.

5. The apparatus of claim 2 wherein the means for processing further includes:
    means for producing a delay after the end of the first interval and before both the measurement of the voltage by the means for measuring and the beginning of the second interval, to allow that portion of the voltage caused by eddy currents in the motor to decay.

6. The apparatus of claim 5 further including means connected across said one or more windings for limiting the voltage applied to the means for processing to less than a predetermined value so that voltage spikes produced by the current pulse do not saturate the means for processing.

7. The apparatus of claim 5 wherein the means for measuring includes means for integrating the voltage over a second interval having a duration substantially less than the rotor time constant of the motor.

8. The apparatus of claim 5 wherein the delay is at least approximately 4 milliseconds.

9. The apparatus of claim 5 wherein the delay is between approximately 4 to 8 milliseconds.

10. The appartus of claim 5 wherein the motor is a three-phase induction motor having first, second, and third terminals for applying current to three stator windings;
    wherein said means for applying includes:
        means for applying said signal across the first and second terminals of the motor so that current pulse flows through two of the stator windings during the first interval; and
        means for preventing current from flowing in the third stator winding during the first interval; and wherein the means for processing is responsive to the voltage across the first and second terminals.

11. The apparatus of claim 10 further including means connected across the first and second terminals for limiting the voltage applied to the means for processing to less than a predetermined value.

12. A method for measuring the inductance and rotor resistance of an induction motor comprising the steps of:
applying a signal across one or more stator windings of the motor to cause a DC current pulse of a substantially constant magnitude to flow through said one or more stator windings for a first interval of time;
preventing current from flowing through the one or more stator windings after the end of the first interval of time;
providing a delay for a period of time after the first interval of time;
measuring the amplitude of the voltage across the one or more stator windings after the delay to provide a value representative of the rotor resistance; and
integrating the voltage over a second interval which begins after the delay and which extends until the voltage decays to substantially zero.

13. The method of claim 12 wherein the first interval of time is sufficiently long that current flow in the rotor induced by the current pulse decays to substantially zero during the first interval.

14. The method of claim 13 further comprising the step of:
repeating the steps of applying, preventing, providing, measuring, and integrating a plurality of times, the magnitude of the current pulse being varied with each repetition in a series of steps through a predetermined range, whereby inductance and rotor resistance of the motor are characterized over a range of operating currents.

15. The method of claim 13 further including the step of applying the values representative of the inductance and rotor resistance of the motor to a flux-feed-forward motor controller.

16. Circuitry for measuring the inductance and rotor resistance of a three-phase induction motor comprising:
a flux-feed-forward motor controller, responsive during periodic intervals of operation to input signals representative of a particular dynamic response desired from the motor, for providing control signals representative of stator current magnitude and frequency which will produce the desired dynamic response;
motor drive circuitry responsive to the control signals from the motor controller for causing stator currents of said magnitude and frequency to flow in the stator windings;
means, operative between said intervals of operation, for driving a substantially rectangular current through two of said stator windings while preventing current from flowing in the third of said stator windings;
means, operative between said intervals of operation, for measuring the voltage across said two stator windings at a first time occurring after the end of the current pulse, to provide a first output signal representative of the rotor resistance; and
first integrating means, operative between said intervals of operation, for integrating the voltage across the two stator windings over an interval beginning at substatially the first time and ending after the voltage has reached substantially zero to provide a second output signal representative of the motor inductance.

17. The circuitry of claim 16 further including:
means for producing a delay between the end of the current pulse and the occurrence of the first time, the delay being long enough to allow that component of the voltage acrodd the two stator windings caused by eddy currents in the motor to decay to substantially zero.

18. The circuitry of claim 17 further including means for limiting the voltage acrodd the two windings to a predetermined value thereby preventing the means for measuring and the means for integrating from being saturated by voltage spikes produced by the current pulse.

19. The circuitry of claim 18 wherein the means for measuring includes: integrating means for integrating the voltage over a second interval starting at said first time to provide said first output signal.

20. The circuitry of claim 19 wherein the first interval is greater than five rotor time constants of the motor; and
wherein the second interval is less than five percent of the rotor time constant.

21. The circuitry of claim 18 wherein the first and second means for integrating include reset integrators which are reset to zero prior to the beginning of the current pulse.

22. The circuitry of claim 19 further including:
means for dividing the first output signal by a value proportional to the magnitude of the current multiplied by the integration interval to provide an output value substantially equal to the rotor resistance; and
means for dividing the second output signal by a value proportional to the magnitude of the current pulse to provide an output value substantially equal to the motor inductance.

* * * * *